(12) United States Patent
Ting et al.

(10) Patent No.: US 8,853,021 B2
(45) Date of Patent: Oct. 7, 2014

(54) EMBEDDED TRANSISTOR

(75) Inventors: Yu-Wei Ting, Taipei (TW); Kuo-Ching Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 414 days.

(21) Appl. No.: 13/273,012

(22) Filed: Oct. 13, 2011

(65) Prior Publication Data

US 2013/0092989 A1    Apr. 18, 2013

(51) Int. Cl.
*H01L 21/336* (2006.01)
*H01L 29/78* (2006.01)
*H01L 29/66* (2006.01)
*H01L 27/108* (2006.01)

(52) U.S. Cl.
CPC .......... *H01L 29/78* (2013.01); *H01L 29/66621* (2013.01); *H01L 27/10876* (2013.01)
USPC .......................................... 438/197; 257/368

(58) Field of Classification Search
CPC ................... H01L 27/10876; H01L 27/10894; H01L 29/4236; H01L 29/66621
See application file for complete search history.

(56) References Cited

U.S. PATENT DOCUMENTS

2012/0049255 A1* 3/2012 Ryu .............................. 257/296
2012/0164812 A1* 6/2012 Ryu et al. ...................... 438/381

FOREIGN PATENT DOCUMENTS

KR        2009096996 A  *  9/2009

* cited by examiner

*Primary Examiner* — Ha Tran T Nguyen
*Assistant Examiner* — Raj R Gupta
(74) *Attorney, Agent, or Firm* — Slater and Matsil, L.L.P.

(57) ABSTRACT

An embedded transistor for an electrical device, such as a DRAM memory cell, and a method of manufacture thereof is provided. A trench is formed in a substrate and a gate dielectric and a gate electrode formed in the trench of the substrate. Source/drain regions are formed in the substrate on opposing sides of the trench. In an embodiment, one of the source/drain regions is coupled to a storage node and the other source/drain region is coupled to a bit line. In this embodiment, the gate electrode may be coupled to a word line to form a DRAM memory cell.

20 Claims, 11 Drawing Sheets

EMBEDDED TRANSISTOR

BACKGROUND

Generally, complementary metal oxide-semiconductor (CMOS) transistors include a gate electrode and a gate dielectric, which are formed on a substrate (usually a silicon semiconductor substrate). Lightly doped drains are formed on opposing sides of the gate electrode by implanting N-type or P-type impurities into the substrate. An oxide liner and one or more implant masks (commonly referred to as spacers) are formed adjacent the gate electrode, and additional implants are performed to complete the source/drain regions. Current flowing through the source/drain regions may then be controlled by controlling the voltage levels applied to the gate electrode.

Reduction in the size of CMOS transistors has provided continued improvement in speed, performance, circuit density, and cost per unit function over the past few decades. As the gate length of the conventional bulk MOSFET is reduced, the source and drain increasingly interact with the channel and gain influence on the channel potential. Consequently, a transistor with a short gate length suffers from problems related to the inability of the gate to substantially control the on and off states of the channel.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure. Throughout the various views and illustrative embodiments of the present disclosure, like reference numbers are used to designate like elements.

Figure 1:
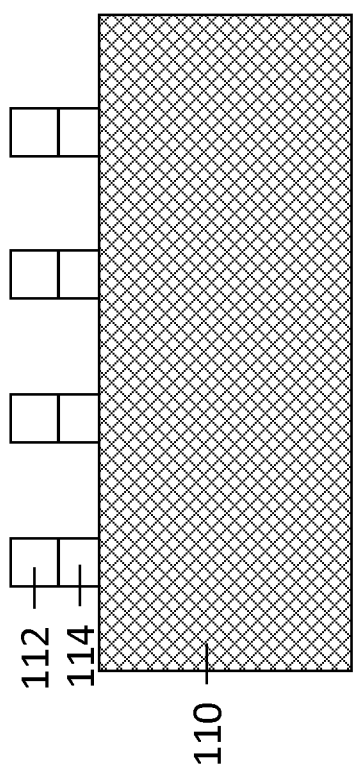
FIGS. 1-8 illustrate various intermediate stages in the manufacturing of an embedded transistor in accordance with an embodiment.

Referring first to FIG. 1, a substrate 110 is provided with a first patterned mask 112 formed thereon. The substrate 110 may comprise any semiconductor material and may comprise known structures including a graded layer or a buried oxide, for example. In an embodiment, the substrate 110 comprises bulk silicon that may be undoped or doped (e.g., p-type, n-type, or a combination thereof). Other materials that are suitable for semiconductor device formation may be used. In an embodiment, however, the substrate 110 is bulk silicon.

The first patterned mask 112 is formed to pattern the underlying materials, such as the underlying substrate 110. In an embodiment, the first patterned mask 112 comprises a photoresist material that has been masked, exposed, and developed. Generally, the photoresist material is deposited, irradiated (exposed) and developed to remove a portion of the photoresist material, thereby defining a pattern as illustrated in FIG. 1. The remaining photoresist material protects the underlying material from subsequent processing steps, such as etching.

Also shown in FIG. 1 is an optional hard mask 114. The hard mask 114 is a protective layer to prevent the underlying structures, such as the substrate 110, from being removed during an etching process. In some situations, a mask in addition to the first patterned mask 112 is desirable due to the materials to be patterned, the duration of the etch process, the types of etchants used, and the like. In an embodiment in which the substrate 110 is a silicon substrate, one such suitable hard mask 114 comprises an oxide layer, such as a silicon oxide layer, and an overlying nitride layer, such as a silicon nitride ($Si_3N_4$) layer. The oxide layer may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. The oxide layer may also be formed, for example, by an in-situ steam generation (ISSG) process in an ambient environment of $O_2$, $H_2O$, NO, a combination thereof, or the like. In an embodiment, the oxide layer is about 50 Å to about 100 Å in thickness. The nitride layer may be formed using CVD techniques using silane and ammonia as precursor gases. The nitride layer may be patterned using $CHF_3$ plasma, and the oxide layer may be patterned using $CF_4$ plasma.

One of ordinary skill in the art will appreciate that other mask materials and/or structures may be used to form either or both of the first patterned mask 112 and the hard mask 114. For example, other materials, a single layer, three or more layers, or the like may be used. In an alternative embodiment, the hard mask may comprise a single silicon nitride layer without an underlying oxide layer.

Figure 2:
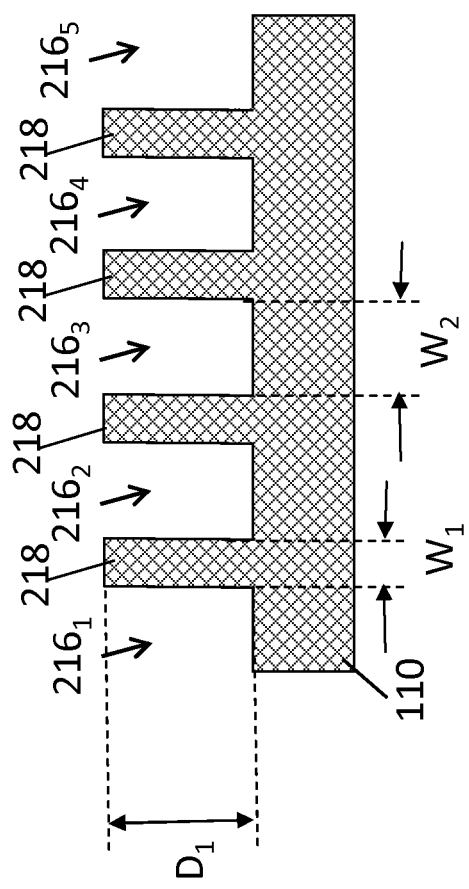

FIG. 2 illustrates the substrate 110 after the substrate has been patterned in accordance with an embodiment. The substrate 110 may be patterned by performing one or more etching steps, thereby forming trenches $216_1$-$216_5$ (collectively referred to as trenches 216) having fins 218 interposed between adjacent ones of the trenches 216. The substrate 110 may be etched by, for example, $HBr/O_2$, $HBr/Cl_2/O_2$, or $SF_6/Cl_2$ plasma. As will be discussed in greater detail below, the fins 218 will form source/drain regions of a transistor, while alternating ones of the trenches will form the gate electrodes of the transistor. Other ones of the trenches will form an isolation structure, e.g., shallow trench isolations (STIs).

In the embodiment illustrated in FIG. 2, the trenches 216 may have a depth $D_1$ (and hence the height of the fins 218) of about 1,000 Å to about 4,000 Å, and the fins 218 may have a width $W_1$ of about 100 Å to about 800 Å. While the width $W_1$ of the fins 218 are illustrated in this embodiment are the same, other embodiments may utilize fins 218 of varying widths. As noted above, subsequent processing forms source/drain regions in the upper portions of the fins 218. Thus, the size (e.g., the width and height of the fins 218) may be adjusted to achieve the desired electrical characteristics of the transistor. Moreover, it should be noted that the fins on the same wafer may have different widths and depths.

Additionally, a width $W_2$ of the trenches may also vary. As noted above, the trenches will become the gate electrodes and isolation trenches. As such, the width of the trenches may be adjusted to vary the gate length and the isolation characteristics. For example, it may be desirable in some embodiments to provide wider isolation trenches as compared to the trenches for the gate electrode to provide greater isolation characteristics between adjacent devices. In other embodiments, a wider trench for the gate electrode may be desirable.

Also illustrated in FIG. 2 is the removal of the first patterned mask 112 (see FIG. 1). The first patterned mask 112 may be removed, for example, by an $O_2$ plasma dry strip and a mixture of concentrated sulphuric acid and hydrogen peroxide.

Figure 3:
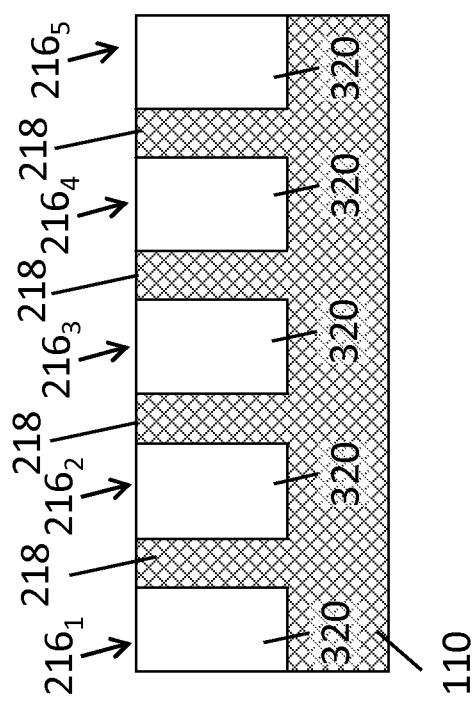

Referring now to FIG. 3, a first dielectric material 320 is formed over the substrate 110, substantially filling the trenches 216. In an embodiment, the first dielectric material 320 comprises a silicon oxide layer that may be formed by a high-density plasma CVD deposition process using $SiH_4$ and $O_2$ mixture.

As illustrated in FIG. 3, the first dielectric material 320 is planarized to a top surface of the substrate 110 in accordance with an embodiment. The first dielectric material 320 may be planarized, for example, by using a chemical-mechanical polishing (CMP) process using an oxide slurry wherein the substrate 110 acts as a stop layer.

Figure 4:
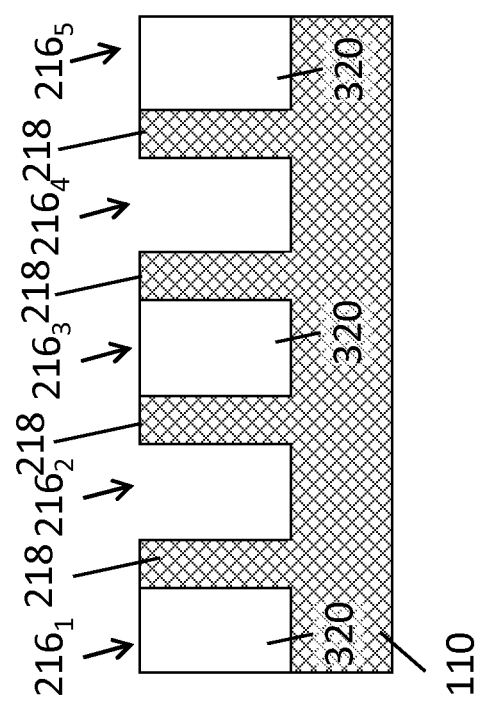

FIG. 4 illustrates removal of the first dielectric material 320 from select ones of the trenches 216, such as trenches $216_2$ and $216_4$. In an embodiment, the first dielectric material 320 may be selectively removed from trenches $216_2$ and $216_4$ by forming and patterning a mask layer (not shown) to protect the first dielectric material 320 in trenches $216_1$, $216_3$, and $216_5$ while leaving the dielectric material in trenches $216_2$ and $216_4$ exposed. The mask may be patterned using photolithography techniques similar to those discussed above with reference to etching the substrate 110 as illustrated in FIGS. 1 and 2. For example, a photoresist material may be formed, exposed according to a desired pattern (e.g., exposing trenches $216_2$ and $216_4$), and developed. Additionally, a hard mask such as that discussed above may also be used.

In an embodiment in which the first dielectric material 320 is a silicon oxide and the substrate 110 is silicon, the first dielectric material 320 may be removed using an anisotropic dry etch process using an etchant having a high etch selectivity between the substrate 110 and the first dielectric material 320, such as $CF_4$ or $C_2F_6$. In this manner, substrate 110 is relatively unaffected while etching or removing the first dielectric material 320.

Figure 5:
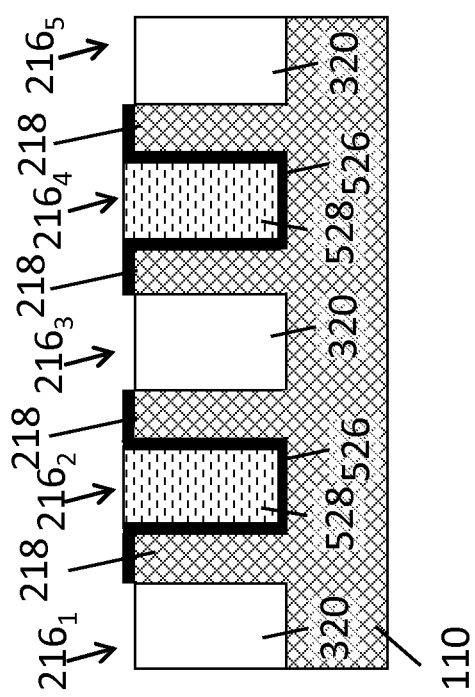

FIG. 5 illustrates the substrate 110 after a gate insulator layer 526 is formed along the surfaces of the trenches $216_2$ and $216_4$ and a gate electrode material 528 is formed within the trenches $216_2$ and $216_4$, in accordance with an embodiment. Generally, the gate insulator layer 526 prevents electron depletion between the source/drain regions and the gate electrode. In an embodiment, the gate insulator layer 526 comprises an oxide layer formed by an oxidation process, such as wet or dry thermal oxidation in an ambient comprising an oxide, $H_2O$, NO, or a combination thereof, an in-situ steam generation (ISSG) process in an ambient environment of $O_2$, $H_2O$, NO, a combination thereof, or the like, or by chemical vapor deposition (CVD) techniques using tetra-ethyl-ortho-silicate (TEOS) and oxygen as a precursor. Other materials including, high k dielectric materials, such as $HfO_2$, $HfSiO_2$, ZnO, $ZrO_2$, $Ta_2O_5$, $Al_2O_3$ and the like, and other processes, such as Atomic Layer Deposition (ALD), Atomic Vapor Deposition (AVD), and the like, may also be used. In an embodiment, the gate insulator layer 526 has a thickness between about 20 Å and about 50 Å. It should be noted that FIG. 5 illustrates that the gate insulator layer 526 does not extend over the first dielectric material 320 for illustrative purposes only. Whether the gate insulator layer 526 extends over the first dielectric material 320 is dependent upon, at least in part, the method used to form the gate insulator layer 526. For example, a thermal process generally results in an embodiment similar to that illustrated in FIG. 5, while the gate insulator layer 526 may extend over the first dielectric material 320 when the gate insulator layer 526 is formed using, e.g., a CVD process or an ISSG process.

Optionally, an implant may be performed to aid or retard the formation of the gate insulator layer 526. For example, a nitrogen implant may be performed to retard an oxide growth in select areas, such as the bottom of the trench, and a fluorine implant may be performed to increase the oxide growth. In an embodiment, a nitrogen implant may be performed at an angle normal to the upper surface of the substrate. In this embodiment, sidewalls of the trenches will be implanted less than the bottom surface of the trench. The nitrogen implant along the bottom of the trench retards the oxide growth, thereby resulting in a thinner gate insulator layer along the bottom of the trenches as compared to the sidewalls of the trench. In another embodiment, the implant angle may be adjusted to implant nitrogen along the sidewalls, thereby resulting in a thicker gate insulator along the bottom as compared to the sidewalls. Similar effects, e.g., relatively thinner or thicker gate insulator layer along the bottom of the trenches, may be obtained using a fluorine implant to increase the relative growth rate of the gate insulator layer.

It should be noted that the substrate 110 may be doped before forming the gate insulator layer to prepare, for example, the channel region. For example, in forming a p-type transistor having p-type doped source/drain regions, an n-type dopant, such as phosphorous, arsenic, nitrogen, antimony, or the like, may be implanted into the channel region (along the sidewalls and bottom of the trenches $216_2$ and $216_4$) of the substrate 110 prior to forming the gate insulator layer 526. Similarly, in forming an n-type transistor having n-type doped source/drain regions, a p-type dopant, such as boron, aluminum, gallium, indium, or the like, may be implanted into the channel region of the substrate. The implant angle may be adjusted to ensure proper implantation along the sidewall regions of the trenches $216_2$ and $216_4$ as well as the bottom of the trenches $216_2$ and $216_4$. Alternatively, the substrate 110 may be doped prior to forming the trenches by forming an n-well or a p-well, respectively, in which the trenches $216_2$ and $216_4$ are formed.

For example, a p-type transistor may be formed by implanting phosphorous ions at an angle of about 0° to about 5° relative to the bottom surface of the trenches $216_2$ and $216_4$ and at an angle between about −25° to about 25° relative to of a vertical sidewall of the trenches $216_2$ and $216_4$ at a dose of about 1E12 to about 3E13 atoms/cm$^2$ and at an energy of about 20 to about 400 KeV. An n-type transistor may be formed by implanting boron ions at an angle of about 0° to about 5° relative to the bottom surface of the trenches $216_2$ and $216_4$ and at an angle between about −25° to about 25° relative to a vertical sidewall of the trenches $216_2$ and $216_4$ at a dose of about 1E12 to about 3E13 atoms/cm$^2$ and at an energy of about 5 to about 300 KeV.

The gate electrode material 528 comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment, the gate electrode layer is formed by depositing, e.g., CVD, low-pressure CVD (LPCVD), and the like, a conformal layer covering the substrate 110 and filling the trenches $216_2$ and $216_4$. Thereafter, a planarizing process, such as a CMP process, may be performed to remove excess material, thereby forming a structure similar to that illustrated in FIG. 5.

The gate electrode material 528 may be deposited doped or undoped. For example, in an embodiment the gate electrode material 528 may be formed by depositing a polysilicon layer and, once applied, the polysilicon may be doped with, for example, phosphorous ions (or other P-type dopants) to form a PMOS device or boron (or other N-type dopants) to form an NMOS device. The polysilicon may also be deposited, for example, by furnace deposition of an in-situ doped polysilicon. Alternatively, the gate electrode material 528 may comprise a polysilicon metal alloy or a metal gate comprising metals such as tungsten, nickel, titanium, and titanium nitride, and the like, for example.

Figure 6:
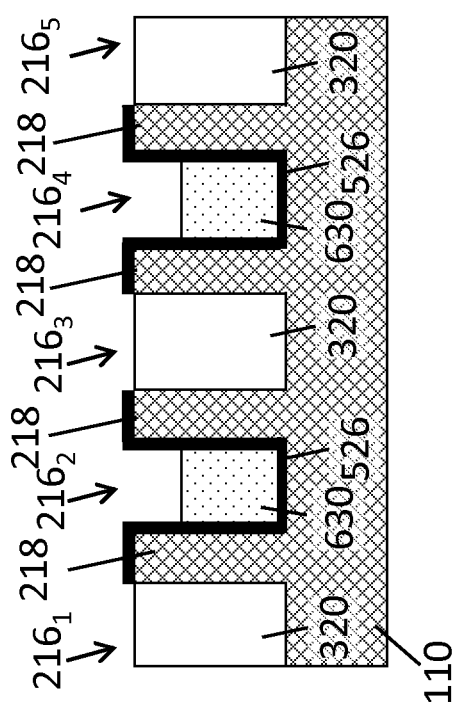

FIG. 6 illustrates recessing of the gate electrode material 528 (see FIG. 5) to form the gate electrodes 630 along the bottom portions of the trenches $216_2$ and $216_4$. In embodiments in which the gate electrode material 528 comprises polysilicon, the recessing may be performed using either dry or wet etching. In the case dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. In the case wet etching is used, the chemicals may include $NH_4OH:H_2O_2:H_2O$ (APM), $NH_2OH$, KOH, $HNO_3:NH_4F:H_2O$, and/or the like. In an embodiment, the gate electrode material 528 is recessed from about 500 Å to about 2,000 Å.

Figure 7:
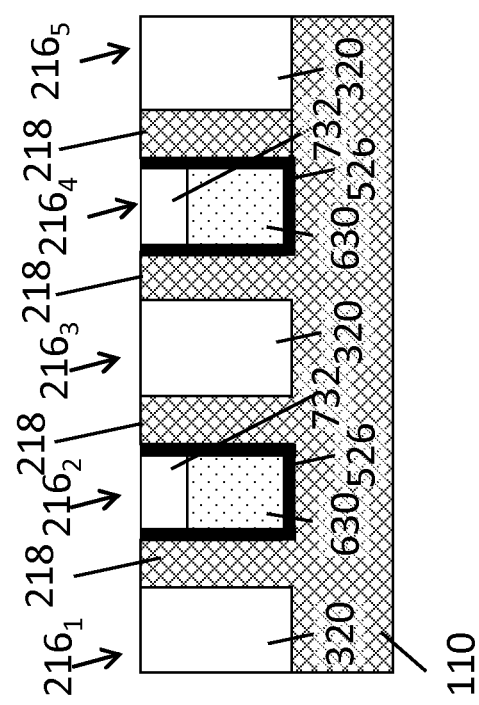

Referring now to FIG. 7, a second dielectric layer 732 is formed over the substrate 110, filling the recesses above the gate electrodes 630 in the trenches $216_2$ and $216_4$. The second dielectric layer 732 may be formed of similar materials using similar processes as those discussed above with reference to the first dielectric material 320. After depositing the second dielectric layer 732, a planarization process, e.g., a CMP process, may be used to remove excess material, thereby forming a structure similar to that illustrated in FIG. 7. In an embodiment, this planarization process exposes the fins 218.

Figure 8:
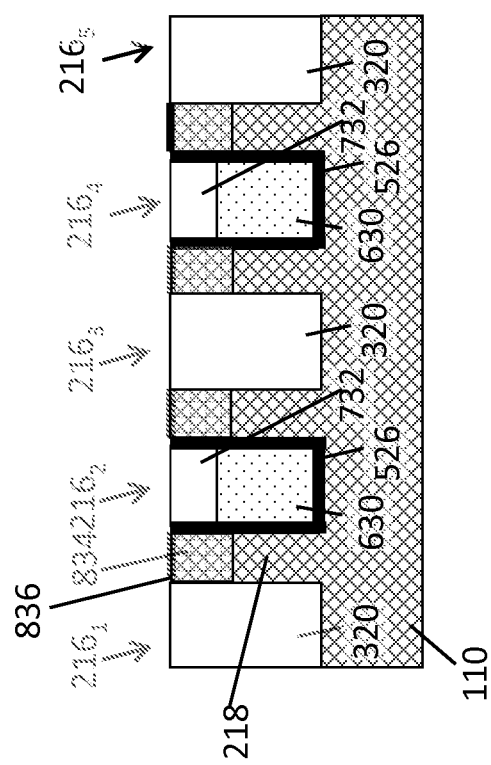

FIG. 8 illustrates formation of the source/drain regions 834 in accordance with an embodiment. The source/drain regions 834 may be doped by implanting n-type or p-type dopants. For example, n-type transistor may be formed by implanting an n-type ion such as phosphorous ions, at a dose of about 1E15 to about 5E15 atoms/cm$^2$ and at an energy of about 20 to about 100 KeV. A p-type transistor may be formed by p-type ions, such as boron ions, at a dose of about 1E15 to about 5E15 atoms/cm$^2$ and at an energy of about 10 to about 50 KeV.

Furthermore, FIG. 8 also illustrates optional silicide areas 836 in accordance with an embodiment. The silicide areas 836 reduce contact resistance between the source/drain regions 834 and contacts formed in subsequent processing steps. The silicide areas 836 may be formed, for example, by depositing a metal layer (not shown) such as titanium, nickel, tungsten, or cobalt via plasma vapor deposition (PVD) procedures. An anneal procedure causes the metal layer to react with the substrate 110, e.g., silicon, of the source/drain regions 834 to form metal silicide. Portions of the metal layer overlying other areas, such as the first dielectric material 320 (e.g., the isolation structures) and second dielectric layer 732 remain unreacted. Selective removal of the unreacted portions of the metal layer may be accomplished, for example, via wet etch procedures. An additional anneal cycle may be used if desired to alter the phase of silicide areas 836, which may result in a lower resistance.

Figure 9:
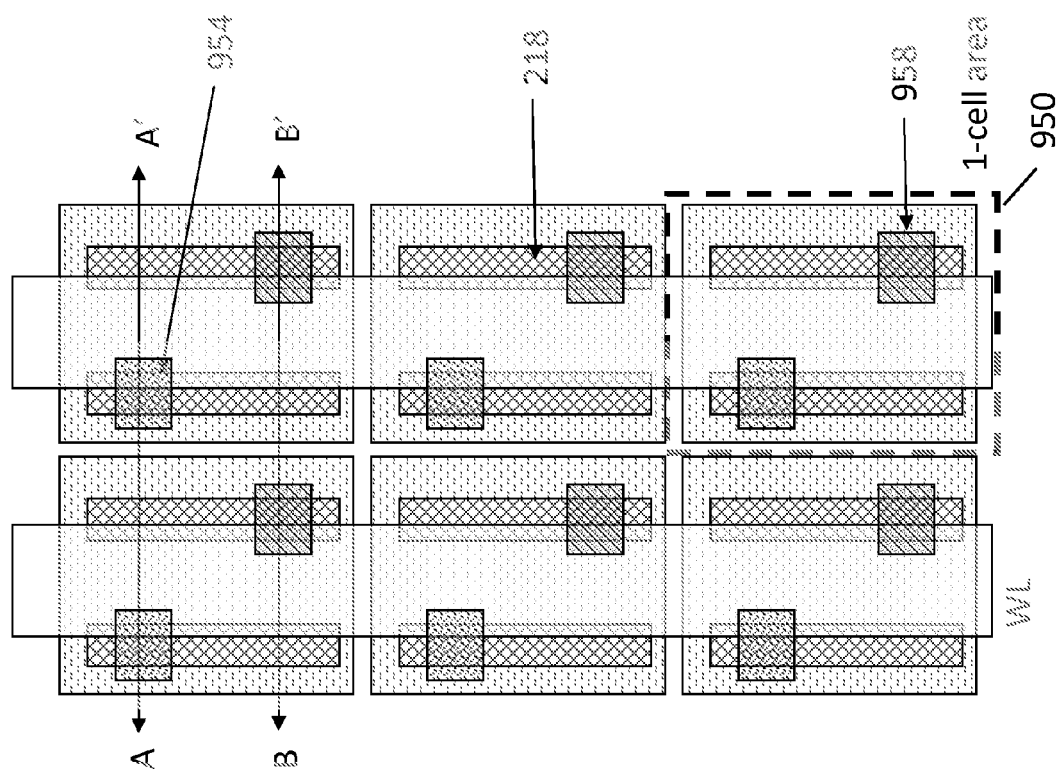
FIG. 9 illustrates a plan view of a memory cell utilizing an embedded transistor in accordance with an embodiment.
Figure 10A:
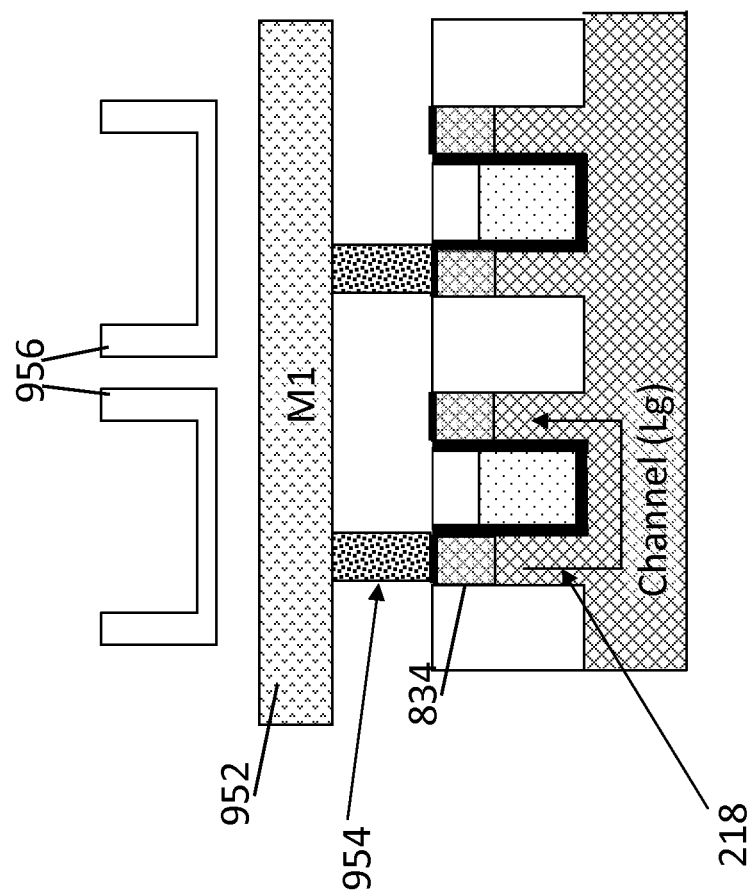
FIGS. 10A and 10B are cross-sectional views of the memory cell illustrated in FIG. 9.
Figure 10B:
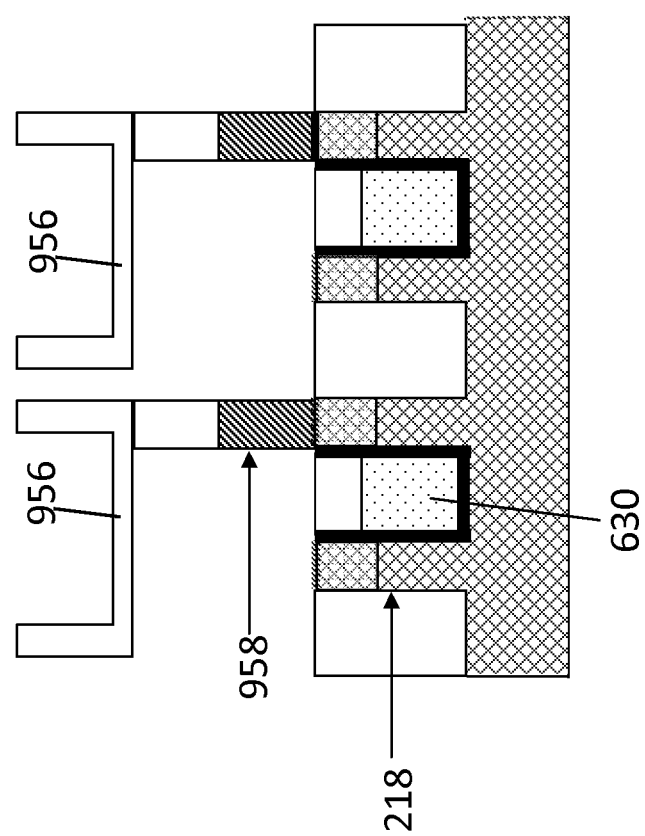

As can be appreciated, the above paragraphs describe embodiments of an embedded transistor that may be used in a variety of applications. For example, FIGS. 9, 10A, and 10B illustrate an embodiment in which the embedded transistor disclosed above is utilized as an access transistor in a DRAM memory cell. In particular, FIG. 9 illustrates a plan view of a plurality of DRAM memory cells, FIG. 10A illustrates a cross-sectional view along the A-A' line of FIG. 9, and FIG. 10B illustrates a cross-sectional view along the B-B' line of FIG. 9. A single memory cell is designated by the dashed box 950.

The memory cell 950 includes bitline 952 formed in, for example, the first metallization layer M1 having bitline contacts 954 electrically coupling the bitline 952 to one of the source/drain regions 834 of the underlying access transistor. The other of the source/drain regions 834 of the access transistor is electrically coupled to a storage node 956 via storage node contacts 958. The storage node 956 may be, for example, a metal-insulator-metal (MIM) capacitor, a planar capacitor, a U-shaped capacitor, a vertical capacitor, a horizontal capacitor, a non-capacitor storage structure, or the like. The gate electrode 630 is electrically coupled to a wordline (WL).

It should be appreciated that embodiments such as some of those discussed above utilize a single mask and etch process to form the isolation trenches and the embedded gate electrodes. In this manner, embodiments disclosed herein using a self-aligned process avoid misalignment issues that may be seen in other approaches in which the isolation trenches and the gate electrode trenches are formed with separate mask and etching processes. It is believed that these embodiments reduce wordline disturbance issues.

Embodiments disclosed herein also allow layout designers greater freedom. For example, the gate length is defined by the depth of the trench as opposed to the pitch between fins, thereby possibly allowing the gate length to be adjusted without increasing the pitch.

In an embodiment, a method is provided. The method comprises providing a substrate having a plurality of trenches; forming a dielectric material in first ones of the plurality of trenches; forming a gate dielectric along sidewalls and a bottom of second ones of the plurality of trenches; forming a gate electrode over the gate dielectric in the second ones of the plurality of trenches; and forming source/drain regions in the substrate on opposing sides of the second ones of the plurality of trenches.

In yet another embodiment, another method is provided. The method comprises providing a substrate; forming a plurality of trenches in the substrate; filling the plurality of trenches in the substrate with a first dielectric material; removing at least a portion of the first dielectric material from select ones of the plurality of trenches; forming a gate dielectric layer along a bottom and sidewalls of the select ones of the plurality of trenches; forming a gate electrode over the gate dielectric layer along a bottom of the select ones of the plurality of trenches; and forming source/drain regions along a surface of the substrate adjacent the select ones of the trenches.

In still yet another embodiment, a device is provided. The device comprises a substrate; a first recess and a second recess in the substrate, the first recess and the second recess having a first depth; a dielectric material in the first recess; a gate dielectric along sidewalls and a bottom of the second recess; a gate electrode over the gate dielectric, the gate electrode being recessed below an uppermost surface of the substrate; and source/drain regions in the substrate on opposing sides of the second recess.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   providing a substrate having a first set of trenches and a second set of trenches;
   forming a dielectric material layer in the first set of trenches and the second set of trenches;
   removing the dielectric material layer in the second set of trenches;
   forming a gate dielectric along sidewalls and a bottom of the second set of trenches;
   forming a gate electrode over the gate dielectric in the second set of trenches; and
   forming source/drain regions in the substrate on opposing sides of the second set of trenches.

2. The method of claim 1, wherein the gate electrode is recessed below an upper surface of the substrate.

3. The method of claim 1, wherein the gate dielectric has a different thickness along a bottom than along sidewalls of the second set of trenches.

4. The method of claim 1, further comprising forming a capacitor electrically coupled to one of the source/drain regions.

5. The method of claim 1, wherein the forming the gate dielectric and the forming the gate electrode comprises:
   depositing a gate dielectric layer over an upper surface of the substrate, along sidewalls of the second set of trenches, and along the bottom of the second set of trenches;
   depositing a gate electrode material over the gate dielectric layer; and
   recessing the gate electrode material such that an uppermost surface of the gate electrode material is lower than an uppermost surface of the substrate.

6. The method of claim 5, further comprising, after the recessing the gate electrode material, forming a dielectric material over the gate electrode material and planarizing a surface of the dielectric material such that the surface is coplanar with a top surface of the substrate.

7. A method comprising:
   providing a substrate;
   forming a plurality of trenches in the substrate;
   filling the plurality of trenches in the substrate with a first dielectric material layer;
   removing at least a portion of the first dielectric material layer from selected ones of the plurality of trenches, the removing exposing a bottom of the selected ones of the plurality of trenches;
   forming a gate dielectric layer along the bottom and sidewalls of the selected ones of the plurality of trenches;
   forming a gate electrode over the gate dielectric layer along the bottom of the selected ones of the plurality of trenches; and
   forming source/drain regions along a surface of the substrate adjacent the selected ones of the trenches.

8. The method of claim 7, further comprising forming a second dielectric material over a top surface of the gate electrode.

9. The method of claim 7, wherein forming the gate dielectric layer comprises forming the gate dielectric such that the gate dielectric has a first thickness along the bottom and a second thickness along sidewalls, the first thickness being different than the second thickness.

10. The method of claim 7, wherein the forming a gate electrode comprises:
    filling the selected ones of the plurality of trenches with a gate electrode material;
    planarizing a surface of the gate electrode material; and
    recessing the gate electrode material within the selected ones of the plurality of trenches.

11. The method of claim 10, further comprising forming a second dielectric layer over the gate electrode, an upper surface of the second dielectric layer being coplanar with an upper surface of the substrate.

12. The method of claim 7, further comprising forming a capacitor electrically coupled to one of the source/drain regions adjacent to at least one of the selected ones of the plurality of trenches.

13. The method of claim 12, further comprising electrically coupling a bit line to another of the source/drain regions adjacent to the at least one of the selected ones of the plurality of trenches.

14. A method comprising:
    providing a substrate;
    forming a first trench and a second trench in the substrate;
    filling the first trench and the second trench with a first dielectric material layer;
    removing the first dielectric material layer from a bottom of the second trench to expose a bottom of the second trench;
    forming a gate dielectric layer along a surface of the bottom of the second trench;
    forming a gate electrode in the second trench, an upper surface of the gate electrode being lower than an upper surface of the substrate; and
    forming source/drain regions along a surface of the substrate adjacent the second trench.

15. The method of claim 14, wherein the forming the gate dielectric layer and the forming the gate electrode comprises:
    depositing a dielectric layer over an upper surface of the substrate, along sidewalls and a bottom of the second trench;
    depositing a gate electrode material over the dielectric layer;
    planarizing the dielectric material and the gate electrode material to expose the substrate between the first trench and the second trench; and
    recessing the gate electrode material such that an uppermost surface of the gate electrode material is lower than an uppermost surface of the substrate, thereby forming the gate dielectric layer and the gate electrode.

16. The method of claim 14, further comprising, after the forming the gate electrode, forming a dielectric material over the gate electrode and planarizing a surface of the dielectric material such that the surface of the dielectric material is coplanar with a top surface of the substrate.

17. The method of claim 14, wherein the gate dielectric has a different thickness along a bottom of the second trench than along sidewalls of the second trench.

18. The method of claim 14, wherein the removing the first dielectric material layer comprises forming a mask over the first dielectric material layer in the first trench and etching the first dielectric material layer in the second trench.

19. The method of claim 14, further comprising forming a capacitor electrically coupled to one of the source/drain regions.

20. The method of claim 19, wherein further comprising electrically coupling a bit line to another of the source/drain regions.

* * * * *